US012796540B2

(12) United States Patent
Buch et al.

(10) Patent No.: US 12,796,540 B2
(45) Date of Patent: Nov. 10, 2026

(54) INTEGRATING DEVICES INTO A CARRIER WAFER FOR THREE DIMENSIONALLY STACKED SEMICONDUCTOR DEVICES

(71) Applicant: ADVANCED MICRO DEVICES, INC., Santa Clara, CA (US)

(72) Inventors: Chintan Buch, Santa Clara, CA (US); Raja Swaminathan, Austin, TX (US)

(73) Assignee: ADVANCED MICRO DEVICES, INC., Santa Clara, CA (US)

( * ) Notice: Subject to any disclaimer, the term of this patent is extended or adjusted under 35 U.S.C. 154(b) by 851 days.

(21) Appl. No.: 17/957,483

(22) Filed: Sep. 30, 2022

(65) Prior Publication Data

US 2024/0113070 A1 Apr. 4, 2024

(51) Int. Cl.

*H10W 90/00* (2026.01)
*H10W 72/00* (2026.01)
*H10W 80/00* (2026.01)
*H10W 90/20* (2026.01)

(52) U.S. Cl.

CPC ........ *H10W 90/00* (2026.01); *H10W 72/0198* (2026.01); *H10W 80/312* (2026.01); *H10W 80/327* (2026.01); *H10W 90/20* (2026.01); *H10W 90/297* (2026.01); *H10W 90/722* (2026.01); *H10W 90/724* (2026.01); *H10W 90/792* (2026.01)

(58) Field of Classification Search

None
See application file for complete search history.

(56) References Cited

U.S. PATENT DOCUMENTS

| | | | | |
|---|---|---|---|---|
| 9,899,355 | B2 * | 2/2018 | Yuan | H01L 25/167 |
| 2014/0077385 | A1 * | 3/2014 | Harper | H01L 25/16 257/774 |
| 2015/0302975 | A1 * | 10/2015 | Qi | H01F 5/00 336/200 |
| 2016/0111398 | A1 * | 4/2016 | Hsiao | H01L 21/486 438/386 |
| 2017/0092626 | A1 * | 3/2017 | Yuan | H01L 25/167 |
| 2019/0371763 | A1 * | 12/2019 | Agarwal | H01L 24/81 |
| 2021/0098409 | A1 * | 4/2021 | Chen | H01L 23/544 |
| 2021/0249380 | A1 * | 8/2021 | Chen | H01L 21/78 |
| 2022/0278074 | A1 * | 9/2022 | Chen | H10P 54/00 |
| 2023/0268319 | A1 * | 8/2023 | Agarwal | H10W 90/00 257/738 |
| 2023/0275063 | A1 * | 8/2023 | Hong | H01L 24/08 257/777 |

* cited by examiner

*Primary Examiner* — Telly D Green

(57) ABSTRACT

A method of forming a semiconductor assembly includes forming a set of through-silicon vias in a carrier wafer, where a layer of the carrier wafer includes integrated devices. A die is coupled to a top surface of the carrier wafer including the set of through-silicon vias using hybrid bonding. One or more connection layers of the die are coupled to one or more of the through-silicon vias and coupled to one or more of the integrated devices. A second wafer is coupled to a top surface of the die. An amount is removed from a bottom surface of the carrier wafer that is parallel to and opposite to the top surface of the carrier wafer to reveal a conductive portion of at least one of the through-silicon vias.

20 Claims, 6 Drawing Sheets

INTEGRATING DEVICES INTO A CARRIER WAFER FOR THREE DIMENSIONALLY STACKED SEMICONDUCTOR DEVICES

BACKGROUND

Conventionally, passive devices, such as inductors and capacitors, are surface mount devices for semiconductor devices. Such passive devices act as charge reservoirs and as supplemental power supply sources for semiconductor devices during certain compute events. However, such conventional systems have a relatively large interconnect distance between passive devices and a semiconductor device, causing parasitic losses for charge provided to semiconductor devices by the passive devices. Such parasitic losses create a bottleneck for power management requirements for increasingly complex semiconductor devices.

DETAILED DESCRIPTION

Figure 1:
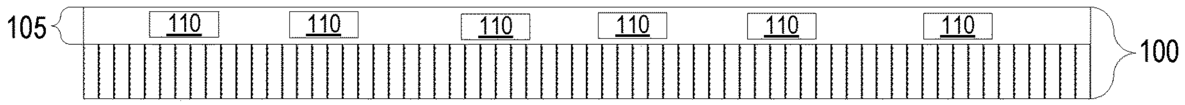
FIG. 1 is part of a process flow for manufacturing a semiconductor assembly including one or more integrated devices in a carrier wafer according to some implementations.

As semiconductor technologies further advance, stacked semiconductor devices (e.g., three dimensional integrated circuits (3DICs)), have emerged as an effective alternative to further reduce the physical size of semiconductor devices. In a stacked semiconductor device, active circuits such as logic, memory, processor circuits, and the like are fabricated on different semiconductor dies. Two or more semiconductor dies may be installed or stacked on top of one another to further reduce the form factor of the semiconductor device. Stacking of semiconductor devices also reduces interconnect distance between the semiconductor devices. Additionally, stacking of semiconductor devices reduces latency or increases bandwidth for exchanging data between the semiconductor devices.

Passive components, such as capacitors and inductors, may be included in semiconductor devices to act as charge reservoirs for providing supplemental power to components of a semiconductor device. Conventionally, such passive components are surface mounted at a package and system level for a semiconductor device. However, with increased complexity of semiconductor devices having in 3D stacked architectures, the power supply from passive components surface mounted at a package or a system level experiences significant parasitic losses due to large electrical distance between the passive component and one or more dies of the stacked semiconductor device, creating latency in providing power from a passive component to one or more of the dies.

In contrast to conventional surface-mounting of passive devices for a semiconductor device, the present specification describes various implementations of a method for forming semiconductor devices that integrates devices, such as passive devices, in a carrier wafer. Integrating the devices into the carrier wafer reduces a length of interconnects between the passive devices and dies relative to surface mounting the passive devices. This reduced interconnect length electrical distance relative to conventional surface mounting of passive devices decreases latency for passive devices integrated into the carrier wafer to provide power to dies, or other components, of a semiconductor assembly. To provide this reduced distance between one or more passive components and one or more dies in a stacked semiconductor device, the present specification sets forth various implementations of a method for forming a semiconductor assembly. The method includes forming a set of through-silicon vias in a carrier wafer, where a layer of the carrier wafer includes integrated devices and coupling a die to a top surface of the carrier wafer using hybrid, where one or more connection layers of the die are coupled to one or more of the through-silicon vias and to one or more of the integrated devices; coupling a second wafer to a top surface of the die. The method further includes removing an amount from a bottom surface of the carrier wafer, where the bottom surface parallel to and opposite to the top surface of the carrier wafer to reveal a conductive portion of at least one of the through-silicon vias.

In some implementations, coupling the second wafer to the top surface of the die includes coupling a bottom surface of an additional die to a top surface of the die and coupling the second wafer to a top surface of the additional die. Further, in some implementations removing the amount from the bottom surface of the carrier wafer, where the bottom surface is parallel to and opposite to the top surface of the carrier wafer to reveal the conductive portion of at least one of the through-silicon vias includes grinding away the amount of the carrier wafer from the bottom surface of the carrier wafer to expose the conductive portion of at least one of the through-silicon vias. In some implementations, the method further includes coupling a solder bump to the conductive portion of the at least one of the through-silicon vias, the connector opposite to the die.

In various implementations, an integrated device is an integrated passive device. In some implementations, the integrated device is a capacitor. The capacitor is a silicon deep trench capacitor in some implementations. In some implementations, an integrated passive device is an inductor.

The present specification further describes a method for forming a semiconductor assembly including coupling, using hybrid bonding, a die to a carrier wafer, where a layer of the carrier wafer includes integrated devices, a bottom surface of the die coupled to the carrier wafer, and where one or more of the integrated devices are coupled to one or more connection layers of the die. The method further couples a second wafer to a top surface of the die and removes an amount from a bottom surface of the carrier wafer, where the bottom surface parallel to and opposite to the top surface of the carrier wafer, to result in the layer of the carrier wafer including the integrated devices remaining coupled to the die. The method further includes forming a set of through-silicon vias in the layer of the carrier wafer between the layer of the carrier wafer including the integrated devices and coupled to the die at a time after removing the amount from the bottom surface of the carrier wafer. In some implementations, coupling the second wafer to the top surface of each of the one or more dies couples a bottom surface of an additional die to a top surface of one or more of the dies and couples the second wafer to a top surface of the additional die. In some implementations, the method includes coupling a solder bump to a conductive portion of at least one of the through-silicon vias exposed from the layer of the carrier wafer, the solder bump opposite to the die.

In various implementations, an integrated device is an integrated passive device. In some implementations, the integrated device is a capacitor. The capacitor is a silicon deep trench capacitor in some implementations. In some implementations, an integrated passive device is an inductor.

In some implementations, removing the amount from the bottom surface of the carrier wafer, the bottom surface parallel to and opposite to the top surface of the carrier wafer, resulting in the layer of the carrier wafer including the integrated devices, is grinding away the amount from a bottom surface of the carrier wafer. In some implementations, the amount from the bottom surface of the carrier wafer is based on a difference between a thickness of the carrier wafer and a thickness of the layer of the carrier wafer including the integrated devices.

The present specification also describes a semiconductor assembly including a die coupled to one or more integrated devices by one or more through-silicon vias, the die formed by removing one or more portions of a carrier wafer, where the carrier wafer includes the one or more integrated devices and the one or more through-silicon vias and wherein the one or more portions removed from the carrier wafer do not include the one or more integrated devices and the one or more through-silicon vias. In some implementations, the semiconductor assembly further includes an additional die coupled to a top surface of the die, where the top surface of the die opposite to a surface of the die coupled to the layer of the carrier wafer. In some implementations, an integrated device is an integrated passive device. The integrated passive device is a capacitor in some implementations.

The following disclosure provides many different implementations, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows include implementations in which the first and second features are formed in direct contact, and also include implementations in which additional features formed between the first and second features, such that the first and second features are in direct contact. Further, spatially relative terms, such as "beneath," "below," "lower," "above," "upper," "back," "front," "top," "bottom," and the like, are used herein for ease of description to describe one element or feature's relationship to another element(s) or feature(s) as illustrated in the figures. Similarly, terms such as "front surface" and "back surface" or "top surface" and "back surface" are used herein to more easily identify various components, and identify that those components are, for example, on opposing sides of another component. The spatially relative terms are intended to encompass different orientations of the device in use or operation in addition to the orientation depicted in the figures.

FIGS. 1-6 show steps in an example manufacturing process for a semiconductor assembly including one or more integrated devices 110 in a layer of a carrier wafer 100. Beginning with FIG. 1, a layer 105 of a carrier wafer 100 includes one or more integrated devices 110. In various implementations, the one or more integrated devices 110 are integrated passive devices. Example integrated passive devices 110 include capacitors, inductors, resistors, or other suitable components. As an example, an integrated passive device 110 is a silicon deep trench capacitor. In other implementations, the one or more integrated devices in the layer 105 of the carrier wafer 100 include active devices, such as one or more transistors. The layer 105 of the carrier wafer 100 including the one or more integrated devices 110 is a fraction of an overall thickness of the carrier wafer 100. For example, the carrier wafer 100 has a thickness of 700 microns, while the layer 105 of the carrier wafer 100 including the one or more integrated devices 110 is 50 microns thick. In various embodiments, the integrated devices 110 act as one or more charge reservoirs for components of the semiconductor assembly.

In various implementations, the carrier wafer 100 is a high-yield wafer that results in at least a threshold percentage of working dies produced during a fabrication process. A yield of a wafer is determined as a ratio of a number of working (or functional) dies produced during fabrication using the wafer to a total number of dies produced during fabrication using the wafer. In some implementations, a high-yield wafer has a yield equaling or exceeding 99%, so using the high-yield wafer as the carrier wafer 100 results in 99% of the dies produced during fabrication using the carrier wafer 100 being functional.

Figure 2:
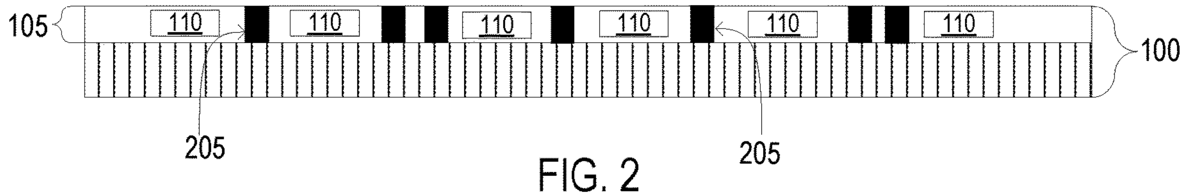
FIG. 2 is part of a process flow for manufacturing a semiconductor assembly including one or more integrated devices in a carrier wafer according to some implementations.

Referring to FIG. 2, a set of through-silicon vias 205 are formed in the carrier wafer 100. A through-silicon via 205 may be etched into the carrier wafer 100 through lithography, such as through photolithography. After etching the through-silicon via 205, an insulating layer is applied to the carrier wafer 100 and to through-silicon vias to electrically isolate a subsequently applied conductive material from the carrier wafer 100. The insulating layer may be implemented as silicon dioxide, silicon nitride, or alumina. The insulating layer may be deposited using different methods in different implementations. A barrier layer is applied to the insulating layer, with the barrier layer preventing diffusion or electromigration of the subsequently applied conductive material during subsequent operation. In one example, the barrier material is tantalum nitride, although platinum or other materials are used as the barrier material in other aspects. The barrier material may be applied through physical vapor deposition, atomic layer deposition, or through other methods in various implementations.

A seed layer of the conductive material is applied to the barrier material. In some implementations, the seed layer is applied through physical vapor deposition, with other methods used to apply the conductive material in other implementations. The conductive material is applied to the seed layer to form a through-silicon via 205. The conductive material may be applied to the seed layer in various ways, including, for example, through electrochemical deposition. Further, in some implementations, the seed layer comprises a different conductive material than the conductive material applied to the seed layer, while in other implementations, a common conductive material comprises the seed layer and is applied to the seed layer. In other implementations, the through-silicon vias 205 are formed using any suitable method or combination of methods.

Figure 3:
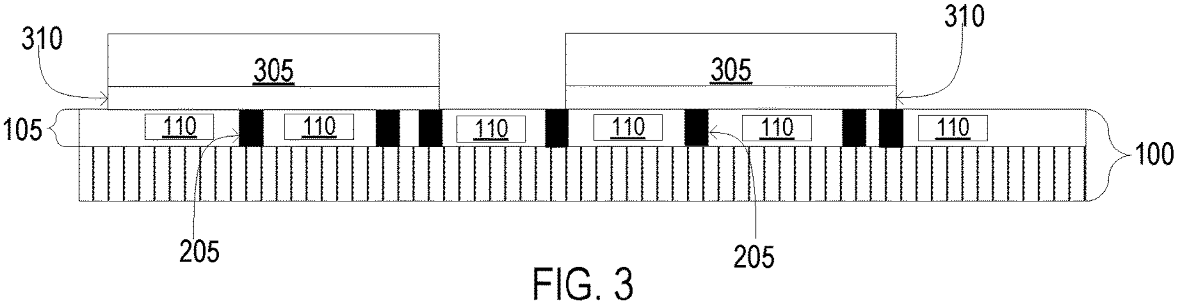
FIG. 3 is part of a process flow for manufacturing a semiconductor assembly including one or more integrated devices in a carrier wafer according to some implementations.

As shown in FIG. 3, one or more dies 305 are coupled to a top surface of the carrier wafer 100 at a time after the set of through-silicon vias 205 are formed. As used here, the "top surface" of the carrier wafer 100 is a surface of the carrier wafer 100 where a conductive portion of one or more the integrated devices 110 are exposed. The top surface of the carrier wafer 100 is a surface of the layer 105 of the carrier wafer 100 including one or more exposed conductive portions of the integrated devices 110. The carrier wafer 100 also includes a "bottom surface" that is generally opposite to and substantially parallel to the top surface. The bottom surface of the carrier wafer 100 does not include exposed conductive portions of the integrated devices 110.

A die 305 implements one or more component functions for a system on chip (SoC). For example, the die 305 is an active interposer die configured to direct signals or power to other components of the semiconductor assembly, such as to other dies (not shown) included in the active semiconductor assembly. In various implementations, the die 305 includes a die substrate comprising a bulk suitable material (e.g., silicon, germanium, or gallium derivatives) and device layers typically fabricated by sequentially depositing insulating or dielectric layers, conductive layers, and semiconductive layers of material over the semiconductor bulk, and patterning the various material layers using photolithography and photomasking to form circuit components and elements (e.g., transistors, capacitors, resistors, etc.). In these examples, the circuit components may be connected to form integrated circuits that implement a functional circuit block of the die 305, such as a processor, interface, memory, or other system component.

Additionally, the die 305 includes one or more connection layers 310. In some examples, the connection layers 310 include layers of metallization and interlevel dielectric material, as well as conductive structures such as vias, traces, and pads. In these examples, the one or more connection layers 310 form connections between the circuit components composed in the die substrate to implement the functional circuit blocks of the die 305. For example, the one or more connection layers 310 implement a die-level redistribution layer structure created during the die fabrication process, such as a back end of line (BEOL) structure. Additionally, the one or more connection layers 310 couple the die 305 to one or more through-silicon vias 205 in the layer 105 of the carrier wafer 100. The through-silicon vias 205 are coupled to one or more of the integrated devices 110 in the layer 105 of the carrier wafer 100, so the one or more connection layers 310 and the through-silicon vias 205 couple the die 305 to one or more of the integrated devices 110 in the layer 105 of the carrier wafer 100. As shown in FIGS. 2 and 3, the one or more dies 305 are coupled to the top surface of the carrier wafer 100 after the through-silicon vias 205 are formed in the layer 105 of the carrier wafer 100.

In various implementations, a die 305 is coupled to the top surface of the carrier wafer 100 using hybrid bonding. A hybrid bond, as the term is used here, refers to a permanent bond that combines a dielectric bond with embedded metal to form interconnections. Using hybrid bonding directly bonds dielectric and interconnect features between the die 305 and the layer 105 of the carrier wafer 100. Hence, hybrid bonding directly couples conductive material comprising the through-silicon vias 205 to conductive material comprising a portion of the one or more connection layers 310 of the die 305. One or more of the integrated devices 110 are coupled to the one or more connection layers 310 of the die 305 through the hybrid bond between the die 305 and the layer 105 of the carrier wafer 100.

Figure 4:
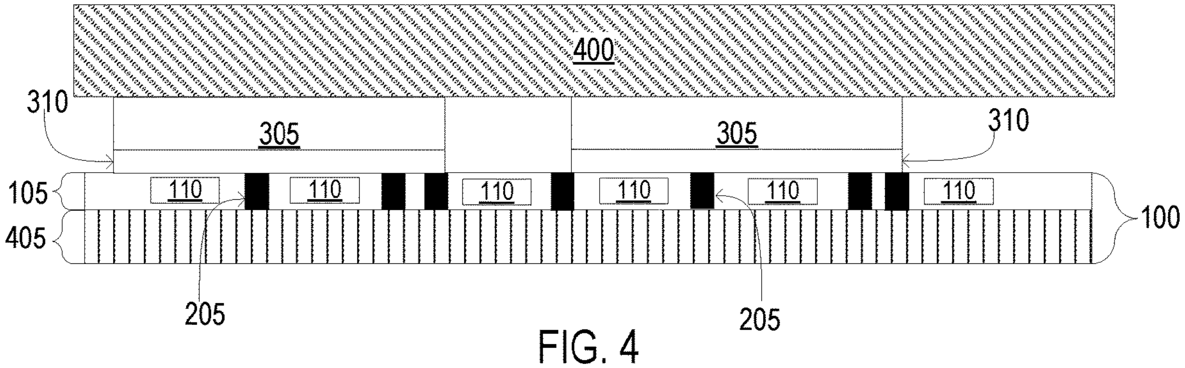
FIG. 4 is part of a process flow for manufacturing a semiconductor assembly including one or more integrated devices in a carrier wafer according to some implementations.

In FIG. 4, a second wafer 400 is coupled to a top surface of each of the one or more dies 305. In some implementations, a gap fill material, such as a gap fill oxide, is applied to areas between different dies 305 to fill space between different dies 305 coupled to the carrier wafer 100 before the second wafer 400 is applied to the top surface of each of the one or more dies 305. As used herein, the "top surface" of a die 305 is a surface of the die that is generally opposite to and is substantially parallel to a surface of the die 305 that is coupled to the top surface of the carrier wafer 100. The second wafer 400 comprises a bulk material without passive or active devices in various implementations. For example, the second wafer 400 is a silicon wafer. In various implementations, the second wafer 400 is coupled to the top surface of a die 305 using fusion bonding. A fusion bond, as the term is used here, refers to joining of two surfaces, such as a surface of the second wafer 400 and the top surface of the die 305, without an intermediate layer between the two surfaces or without external force.

For purposes of illustration, FIG. 4 also identifies an additional layer 405 of the carrier wafer 100. The additional layer 405 of the carrier wafer 100 does not include the one or more integrated devices 110 and is near the bottom surface of the carrier wafer 100. Hence, the carrier wafer 100 includes the layer 105 including the devices 110 that is nearest to the top surface of the carrier wafer 100, and the additional layer 405 of the carrier wafer 100 that does not include the devices and is farther from the top surface of the carrier wafer 100 (or is nearer to the bottom surface of the carrier wafer 100).

Figure 5:
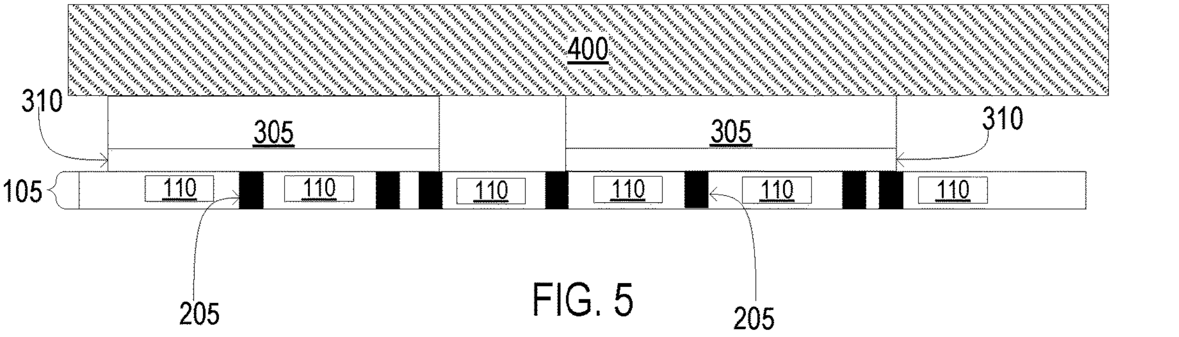
FIG. 5 is part of a process flow for manufacturing a semiconductor assembly including one or more integrated devices in a carrier wafer according to some implementations.

An amount is removed from the bottom surface of the carrier wafer 100 to reveal a conductive portion of at least one of the through-silicon vias 205. As shown in FIG. 5, removal of this amount from the bottom surface of the carrier wafer 100 results in the layer 105 of the carrier wafer 100 including the integrated devices 110 remaining coupled to one or more dies 305, with conductive portions of one or more of the through-silicon vias 205 exposed, while the additional layer 405 of the carrier wafer 100 is removed. In various implementations, the amount of the bottom surface of the carrier wafer 100 is ground away to be removed, while in other implementations, the amount of the bottom surface of the carrier wafer 100 is removed using any suitable method or combination of methods. In the example shown by FIG. 5, the additional layer 405 of the carrier wafer 100 that does not include the integrated devices 110 and the set of through-silicon vias 205 are removed, resulting in a layer of the carrier wafer 100 having a thickness determined by the height of the through-silicon vias 205 remaining coupled to the one or more dies 305. The remaining layer of the carrier wafer 100 coupled to the one or more dies 305 is the layer 105 of the carrier wafer 100 including the integrated devices 110 and the through-silicon vias 205. For example, the carrier wafer 100 has a thickness of 700 microns, while the layer 105 of the carrier wafer 100 including the devices 110 has a thickness of 50 microns, so 650 microns is removed from the bottom surface of the carrier wafer 100, leaving the layer 105 including the integrated devices 110 with a thickness of 50 microns coupled to the one or more dies 305. Hence, the layer 105 of the carrier wafer 100 including the integrated devices 110 remains coupled to the one or more dies 305, differing from conventional techniques where the carrier wafer 100 is fully removed.

Figure 6:
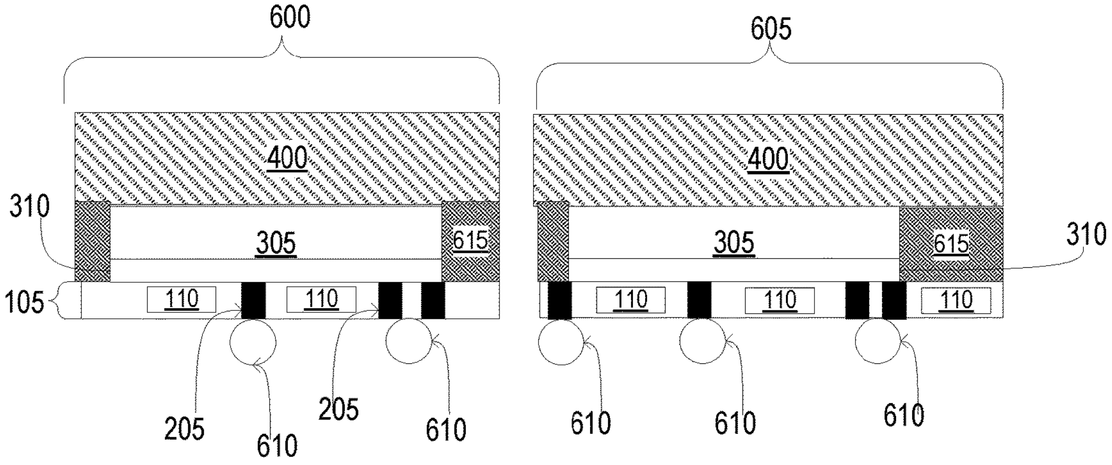
FIG. 6 is an example of semiconductor assemblies including a die coupled to a layer of a carrier wafer including integrated devices according to some implementations.

When removing the amount from the bottom surface of the carrier wafer 100, a conductive portion of one or more of the through-silicon vias 205 is exposed. This allows the exposed conductive portion of a through-silicon via 205 to be coupled to another component. As shown in FIG. 6, the exposed conductive portion of a through-silicon via 205 is coupled to a connection 610 that is opposite to the one or more dies 305. Example connections 610 include, die pads, microbumps, solder bumps (e.g., Controlled Collapse Chip Connection (C4) bumps), or other connections 610 configured to electrically couple the die 305 to a substrate or to one or more other components.

As shown in FIG. 6, the carrier wafer 100 is singulated to separate different dies 305 coupled to the layer 105 of the carrier wafer 100 into discrete semiconductor assemblies 600, 605. Each discrete semiconductor assembly 600, 605 includes a die 305 and a portion of the layer 105 of the carrier wafer 100 coupled to the die 305. Each of the discrete semiconductor assemblies 600, 605 includes a die 305 coupled to a layer 105 of the carrier wafer 100 including the one or more integrated devices 110 and one or more through-silicon vias 205, as well as a portion of the second wafer 400. Additionally, a semiconductor assembly 600, 605 includes one or more connections 610 coupled to one or more of the through-silicon vias 205. A semiconductor assembly 600, 605 also includes a gap fill material 615 that fills areas between the second wafer 400 and a die 305, between the layer 105 of the carrier wafer 100 and the second wafer 400, and between the die 305 and the layer 105 of the carrier wafer 100. In various implementations, the gap fill material 615 is applied before the second wafer 400 is coupled to the top surfaces of the one or more dies 305. The gap fill material 615 is silicon oxide or another type of oxide in some examples. Different methods for singulation, which partitions different dies 305 coupled to the layer 105 of the carrier wafer 100 into discrete semiconductor assemblies 600, 605, are used in various implementations. Hence, each discrete semiconductor assembly 600, 605 includes a layer 105 of the carrier wafer 100 including one or more integrated devices 110 and one or more through-silicon vias 205 for coupling a die 305 to one or more other components.

Figure 7:
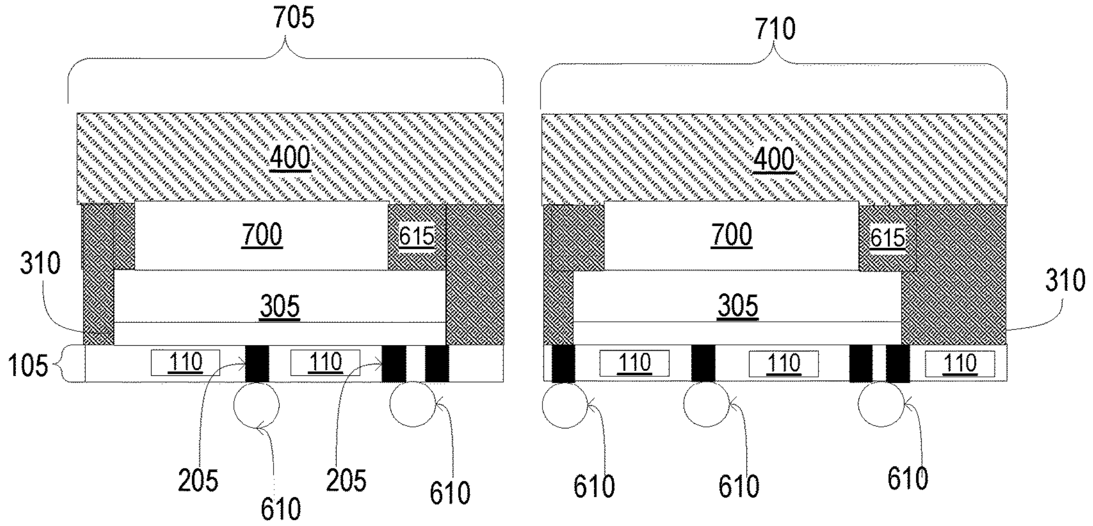
FIG. 7 is an example of an example of semiconductor assemblies including a die coupled to a layer of a carrier wafer including integrated devices and coupled to an additional die according to some implementations.

Multiple dies are stacked on top of each other in various implementations, such as the implementation shown in FIG. 7. In the example depicted by FIG. 7, an additional die 700 is coupled to a die 305. In various implementations, a surface of the additional die 700 is coupled to a back surface of the die 305 that is farthest from the layer 105 of the carrier wafer 100 and that is parallel to the layer 105 of the carrier wafer 100. In various implementations, the surface of the additional die 700 is coupled to the back surface of the die 305 using hybrid bonding. Further, the additional die 700 includes one or more additional connection layers, similar to the one or more connection layers 310 of the die 305 further described above in conjunction with FIG. 3. The one or more connection layers of the additional die 700 are nearest to the surface of the additional die 700 coupled to the surface of the die 305. Additionally, one or more through-silicon vias or other connections couple one or more of the additional connection layers to one or more of the connection layers 310 of the die, allowing data and signals to be communicated between a die 305 and an additional die 700 coupled to the die 305. The second wafer 400 is coupled to a back surface of the additional die 700, with the back surface of the additional die 700 parallel to and opposite to the surface of the additional die 700 coupled to the die 305. A semiconductor assembly 705 710 also includes a gap fill material 615 that fills areas between the second wafer 400 and a die 305, between the layer 105 of the carrier wafer 100 and the second wafer 400, and between the die 305 and the layer 105 of the carrier wafer 100. The gap fill material 615 also fills areas between an additional die 700 and the second wafer 400, areas between an additional die 700 and the layer 105 of the carrier wafer 100 in various implementations. In various implementations, the gap fill material 615 is applied before the second wafer 400 is coupled to the top surface of the additional die 700. The gap fill material 615 is silicon oxide or another type of oxide in some examples.

In FIG. 7, discrete semiconductor assemblies 705, 710 are shown, with each discrete semiconductor assembly 705, 710 including a layer 105 of the carrier wafer 100 including one or more integrated devices 110 and one or more through-silicon vias 205 for coupling a die 305 to an additional component, as well as an additional die 700 coupled to a die 305 and to the second wafer 400. While FIG. 7 shows a single additional die 700 coupled to a die 305, in various implementations, multiple additional dies are coupled to each other along an axis that is perpendicular to the die 305, allowing multiple additional dies 700 to be stacked on top of each other.

Figure 8:
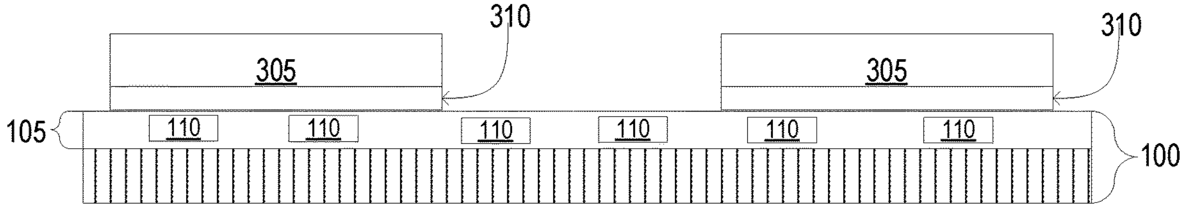
FIG. 8 is part of a process flow for manufacturing a semiconductor assembly including one or more integrated devices in a carrier wafer according to some implementations.

While FIGS. 1-6 show an implementation where through-silicon vias 205 for coupling a die 305 to components are formed before the die 305 is coupled to the layer 105 of the carrier wafer 100, in other implementations, the through-silicon vias 205 are formed after one or more dies 305 are coupled to the layer 105 of the carrier wafer. FIGS. 8-11 are steps in such a process flow for manufacturing a semiconductor assembly including one or more integrated devices 110 in a layer 105 of a carrier wafer 100. In FIG. 8, a layer 105 of a carrier wafer 100 includes one or more integrated devices 110, as further described above in conjunction with FIG. 1. The layer 105 of the carrier wafer 100 including the one or more integrated devices 110 is a fraction of an overall thickness of the carrier wafer 100. For example, the carrier wafer 100 has a thickness of 700 microns, while the layer 105 of the carrier wafer 100 including the one or more integrated devices 110 is 50 microns. In various implementations, the carrier wafer 100 is a high-yield wafer that results in at least a threshold percentage of working dies produced during a fabrication process, as further described above in conjunction with FIG. 1.

As further shown in FIG. 8, one or more dies 305 are coupled to a top surface of the carrier wafer 100. As used here, the "top surface" of the carrier wafer 100 is a surface of the carrier wafer 100 having exposed conductive portions of one or more of the devices 110. Hence, the top surface of the carrier wafer 100 is a surface of the layer 105 of the carrier wafer 100 including the integrated devices 110. In various implementations, a die 305 is coupled to the top surface of the carrier wafer 100 using hybrid bonding. Using hybrid bonding directly bonds dielectric and interconnect features between the die 305 and the layer 105 of the carrier wafer 100, as further described above in conjunction with FIG. 3. The hybrid bond between a die 305 and the top surface of the carrier wafer 100 couples one or more of the integrated devices 110 included in the layer 105 of the carrier wafer 100 to one or more connection layers 310 of a die 305.

Figure 9:
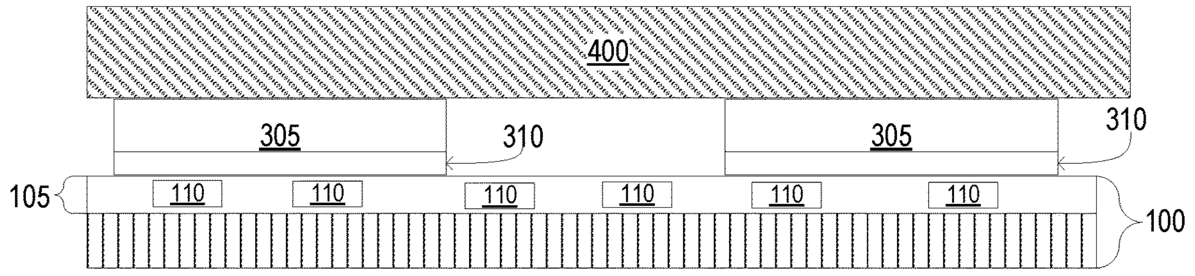
FIG. 9 is part of a process flow for manufacturing a semiconductor assembly including one or more integrated devices in a carrier wafer according to some implementations.

In FIG. 9, a second wafer 400 is coupled to a top surface of each of the one or more dies 305, as further described above in conjunction with FIG. 4. In some implementations, a gap fill material, such as a gap fill oxide, is applied to areas between different dies 305 to fill space between different dies 305 coupled to the carrier wafer 100 before the second wafer 400 is applied to the top surface of each of the one or more dies 305. As used herein, the "top surface" of a die 305 is a surface of the die that is generally opposite to and is substantially parallel to a surface of the die 305 that is coupled to the top surface of the carrier wafer 100.

Figure 10:
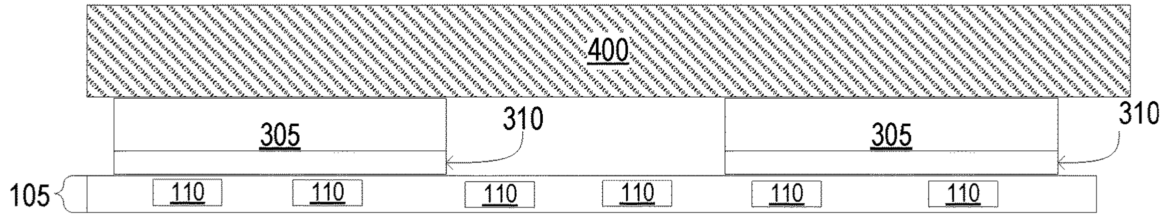
FIG. 10 is part of a process flow for manufacturing a semiconductor assembly including one or more integrated devices in a carrier wafer according to some implementations.

An amount of the carrier wafer 100 is removed from the bottom surface of the carrier wafer 100 so the layer 105 of the carrier wafer 100 including the one or more integrated devices 110 remains coupled to the one or more dies 305, as shown in FIG. 10. The amount removed from the bottom surface of the carrier wafer 100 is based on a thickness of the layer 105 of the carrier wafer 100 including the integrated devices 110. In various embodiments, the amount removed from the bottom surface of the carrier wafer 100 is a difference between a thickness of the carrier wafer 100 and a thickness of the layer 105 of the carrier wafer including the integrated devices 110. For example, the amount removed from the bottom surface of the carrier wafer 100 is within a threshold value of the difference between the thickness of the carrier wafer 100 and the thickness of the layer 105 of the carrier wafer including the integrated devices 110. Hence, the amount is removed from the bottom surface of the carrier wafer 100 after one or more dies 305 are coupled to the layer 105 of the carrier wafer 100. In various implementations, the amount of the carrier wafer 100 is removed after one or more dies 305 are coupled to the layer 105 of the carrier wafer 100 and after the second wafer 400 is coupled to a die 305 (or coupled to an additional die 700 that is coupled to a die 305, as further described above in conjunction with FIG. 7). The amount of the carrier wafer 100 that does not include the integrated devices 110 is ground away from the bottom surface of the carrier wafer 100, while in other implementations, the amount of the carrier wafer 100 is removed using any suitable method or combination of methods. In the example shown by FIG. 10, an additional layer of the carrier wafer 100 that does not include the integrated devices 110 is removed from the bottom surface of the carrier wafer 100, resulting in the layer 105 of the carrier wafer 100 in which the integrated devices 110 are included remaining coupled to the one or more dies 305. For example, the carrier wafer 100 has a thickness of 700 microns, while the layer 105 of the carrier wafer 100 including the devices 110 has a thickness of 50 microns, so 650 microns of the carrier wafer 100 are removed from the bottom surface of the carrier wafer 100, leaving a layer of the carrier wafer 100 having a thickness of 50 microns coupled to the one or more dies 305, with the layer of the carrier wafer coupled to the one or more dies 305 being the layer 105 including the integrated devices 110. Hence, the layer 105 of the carrier wafer 100 including the integrated devices 110 remains coupled to the one or more dies 305, differing from conventional techniques where the carrier wafer 100 is fully removed from the dies 305.

Figure 11:
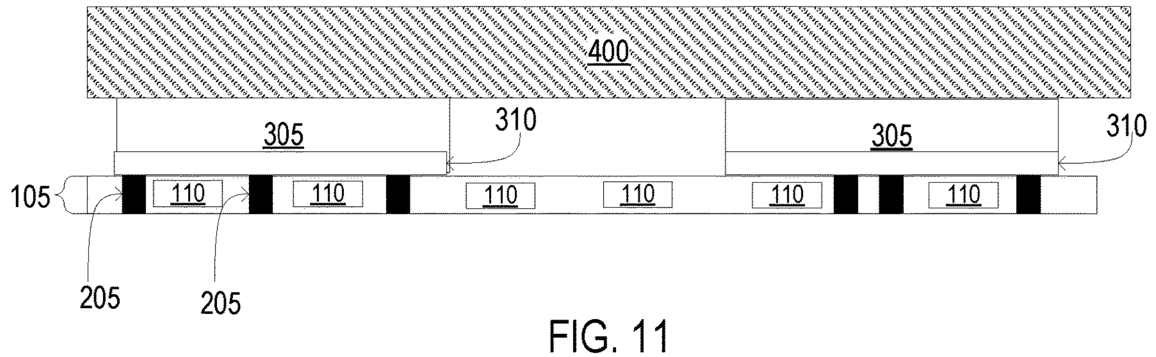
FIG. 11 is part of a process flow for manufacturing a semiconductor assembly including one or more integrated devices in a carrier wafer according to some implementations.

After removing the amount from the bottom surface of the carrier wafer 100 so the layer 105 of the carrier wafer 100 including the integrated devices 110 remains coupled to the one or more dies 305, a set of through-silicon vias 205 are formed in the layer 105 of the carrier wafer 100 including the integrated devices 110 that remains coupled to the one or more dies 305, as shown in FIG. 11. Thus, FIG. 11 shows the set of through-silicon vias 205 formed at a time after the amount was removed from the bottom surface of the carrier wafer 100, so the through-silicon vias 205 are formed in the layer 105 of the carrier wafer 100 that remains coupled to the one or more dies 305 and that includes the integrated devices 110. In various implementations, a through-silicon via 205 is etched into the carrier wafer 100 through lithography, such as through photolithography, to form the through-silicon via. After etching the through-silicon via, an insulating layer is applied to the carrier wafer 100 and to through-silicon via to electrically isolate a subsequently applied conductive material from the carrier wafer 100. In various implementations, the insulating layer is silicon dioxide, while silicon nitride or alumina are applied as the insulating layer in other implementations. The insulating layer is deposited using different methods in different implementations. A barrier layer is applied to the insulating layer, with the barrier layer preventing diffusion or electromigration of the subsequently applied conductive material during subsequent operation. In various implementations, the barrier material is tantalum nitride, although platinum or other materials are used as the barrier material in other implementations. The barrier material is applied through physical vapor deposition, atomic layer deposition, or through other methods in various implementations.

A seed layer of the conductive material is applied to the barrier material. In some implementations, the seed layer is applied through physical vapor deposition, with other methods used to apply the conductive material in other implementations. The conductive material is applied to the seed layer to form a through-silicon via 205. In various implementations, the conductive material is applied to the seed layer through electrochemical deposition, while other methods are used to apply the conductive material in other implementations. Further, in some implementations, the seed layer comprises a different conductive material than the conductive material applied to the seed layer, while in other implementations, a common conductive material comprises the seed layer and is applied to the seed layer. However, in other implementations, the through-silicon vias 205 are formed using any suitable method or combination of methods In various implementations, the through-silicon vias 205 are formed starting from the bottom surface of the layer 105 of the carrier wafer 100 that is substantially parallel to and generally opposite to the top surface of the layer 105 of the carrier wafer 100 to which the die 305 is coupled. Forming the through-silicon vias 205 after removing the amount of the carrier wafer 100 that does not include the one or more integrated devices 110 from the bottom surface of the carrier wafer 100 allows generation of the through-silicon vias 205 in the layer 105 of the carrier wafer 100 without grinding the through-silicon vias 205 when removing the amount from the bottom surface of the carrier wafer 100. When forming the set of through silicon vias 205, conductive portions of one or more of the through-silicon vias 205 are exposed from the layer 105 of the carrier wafer 100, allowing the through silicon vias 205 couple a die 305 to one or more additional components, as further described above in conjunction with FIG. 6. After forming the set of through-silicon vias 205 the one or more dies 305 coupled to the layer 105 of the carrier wafer 100 including the integrated devices 110 are partitioned into discrete semiconductor assemblies, as further described above in conjunction with FIG. 6. Further, an exposed conductive portion of one or more of the through-silicon vias 205 is coupled to a connector 610 to couple the die 305 to another component using a through-silicon via 205 and a connector 610.

Figure 12:
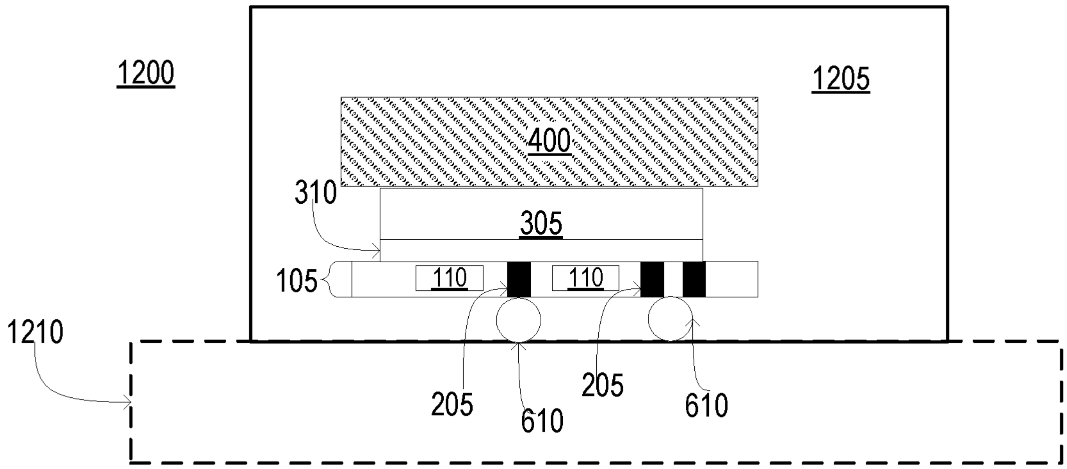
FIG. 12 cross-sectional diagram of an example integrated circuit device including a semiconductor assembly including a die coupled to a layer of a carrier wafer including integrated devices according to some implementations.
Figure 13:
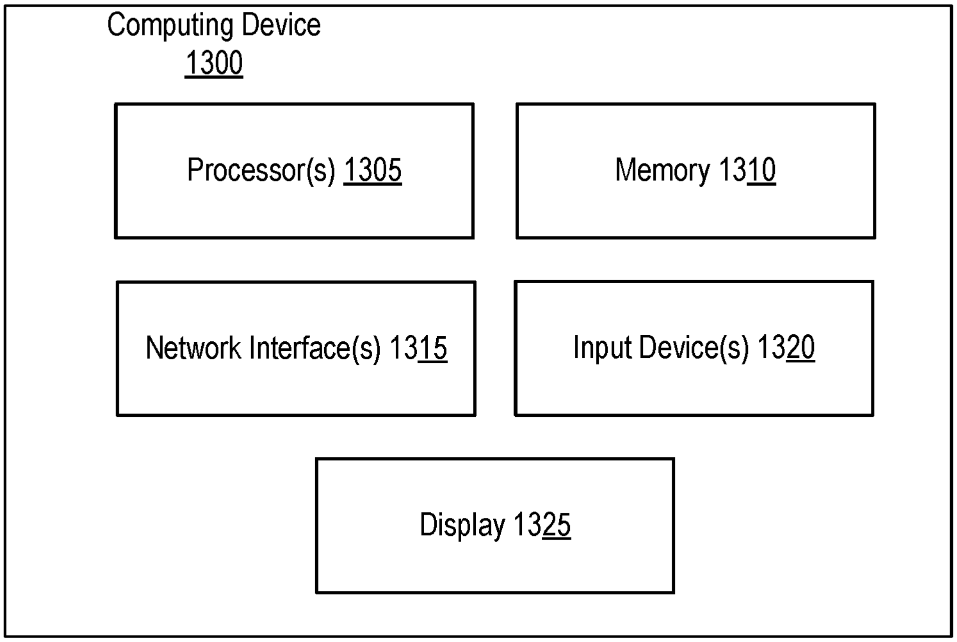
FIG. 13 is an example computing device according to some implementations.

FIG. 12 is a cross-sectional diagram of an example integrated circuit device 1200 including semiconductor assembly including a layer of a carrier wafer including one or more integrated devices. The example integrated circuit device 1200 can be implemented in a variety of computing devices, including mobile devices, personal computers, peripheral hardware components, gaming devices, set-top boxes, smart phones, and the like (as shown in FIG. 13). The example integrated circuit device 1200 of FIG. 12 includes a component 1205. The component 1205 includes a die 305, which is a block of semiconducting material such as silicon onto which a functional integrated circuit is fabricated. As an example, the die 305 includes a processor such as a Central Processing Unit (CPU), a Graphics Processing Unit (GPU), or other processor as can be appreciated. In various implementations, the component 1205 includes a die 305 coupled to a layer 105 of a carrier wafer 100 that includes one or more passive integrated devices 110 and a set of through-silicon vias 205. Coupling of the die 305 to the layer 105 of the carrier wafer 100 is further described above in conjunction with FIGS. 1-11.

The component 1205 is coupled to a substrate 1210. The substrate 1210 is a portion of material that mechanically supports the component 1205. In some implementations, the substrate 1210 also electrically couples various components mounted to the substrate 1210 via conductive traces, tracks, pads, and the like. For example, the substrate 1210 electrically couples die 305 to one or more other components via a connector 610 coupled to a through-silicon via 205 that is coupled to one or more connection layers 310 of the die 305. In various implementations, the connector 610 is a solder ball coupled to a portion of a through-silicon via 205. In some implementations, the substrate 1210 includes a printed circuit board (PCB), while in other implementations the substrate 1210 is another semiconductor device, like die 305 (which may include active components therein). In some implementations, the component 1205 is coupled to the substrate 1210 via a socket (not shown), where the component 1205 is soldered to or otherwise mounted in the socket. In other implementations, as shown in FIG. 12, the component 1205 is directly coupled to the substrate 1210 via a direct solder connection or other connection as can be appreciated that comprises connector 610. In some implementations, the component 1205 is coupled to the substrate 1210 using a land grid array (LGA), pin grid array (PGA), or other packaging technology as can be appreciated.

As an example, the die 305 is implemented as a processor 1305 of a computing device 1300 as shown in FIG. 13. The computing device 1300 may be, for example, a desktop computer, a laptop computer, a server, a game console, a smart phone, a tablet, and the like. In addition to one or more processors 1305, the computing device 1300 includes memory 1310. The memory 1310 includes Random Access Memory (RAM) or other volatile memory. The memory 1310 also includes non-volatile memory such as disk storage, solid state storage, and the like.

In some implementations, the computing device 1300 also includes one or more network interfaces 1315. In some implementations, the network interfaces 1315 include a wired network interface 1315 such as Ethernet or another wired network connection as can be appreciated. In some implementations, the network interfaces 1315 include wireless network interfaces 1315 such as Wi-Fi, BLUETOOTH®, cellular, or other wireless network interfaces 1315 as can be appreciated. In some implementations, the computing device 1300 includes one or more input devices 1320 that accept user input. Example input devices 1320 include keyboards, touchpads, touch screen interfaces, and the like. One skilled in the art will appreciate that, in some implementations, the input devices 1320 include peripheral devices such as external keyboards, mice, and the like.

In some implementations, the computing device 1300 includes a display 1325. In some implementations, the display 1325 includes an external display connected via a video or display port. In some implementations, the display 1325 is housed within a housing of the computing device 1300. For example, the display 1325 includes a screen of a tablet, laptop, smartphone, or other mobile device. In implementations where the display 1325 includes a touch screen, the display 1325 also serves as an input device 1320.

Hence, FIGS. 1-12 depict examples of a process for forming a semiconductor assembly where a die is coupled to a carrier wafer that includes a layer having one or more through-silicon vias and FIG. 13 depicts an example implementation of a semiconductor assembly as a processor of a computer system. The layer of the carrier wafer also includes one or more integrated devices. As further described above, one or more of the integrated devices are integrated passive devices, such as capacitors in various implementations. The process removes portions of the carrier wafer other that the layer of the carrier wafer that includes the one or more through-silicon vias and the one or more integrated passive devices. The remaining layer of the carrier wafer including the one or more through-silicon vias and the one or more integrated devices is singulated to form the semiconductor assembly. As shown in FIG. 7, in some implementations, the process further includes coupling an additional die to the die. The additional die is coupled to a surface of the die that is opposite a surface of the die that is coupled to the layer of the wafer, allowing dies to be stacked vertically atop one another with the integrated devices included in the layer of the carrier wafer positioned below the dies, resulting in reduced interconnect lengths between the integrated devices in the layer of the carrier wafer and the dies.

Figure 14:
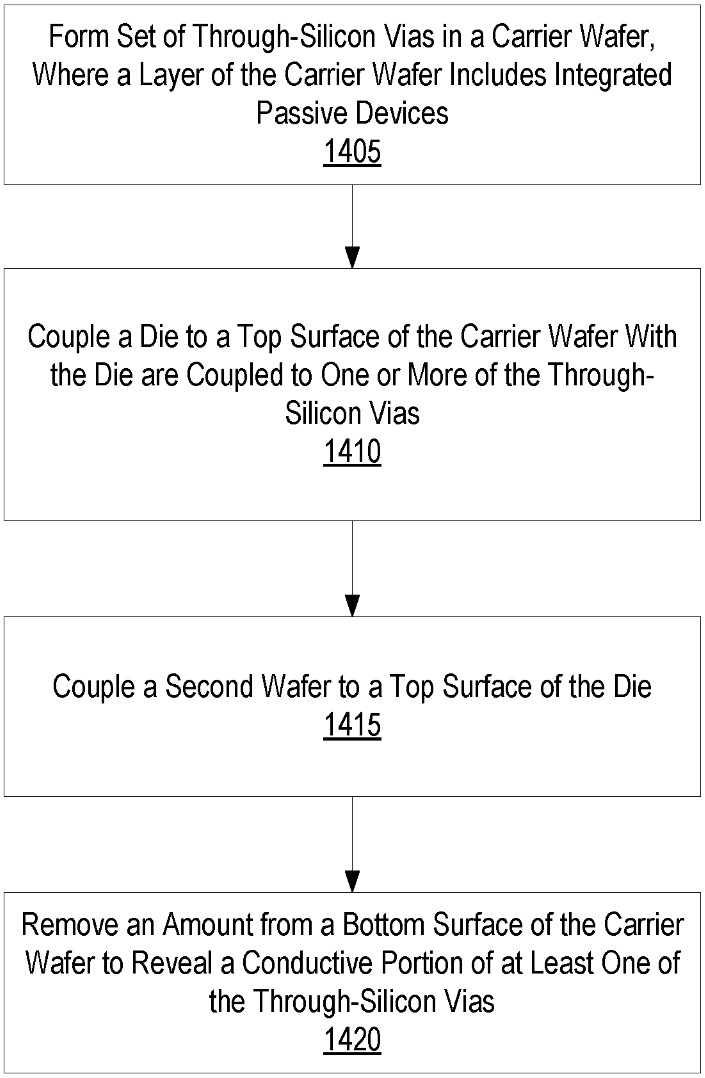
FIG. 14 is a flow chart illustrating an example method for manufacturing a semiconductor assembly including one or more integrated devices in a carrier wafer according to some implementations.

For further explanation, FIG. 14 sets forth a flow chart illustrating an example method for manufacturing a semiconductor assembly including one or more integrated devices 110 in a layer 105 of a carrier wafer 100. The method shown in FIG. 14 includes forming 1405 a set of through-silicon vias 205 in a carrier wafer 100, where the carrier wafer 100 has a layer that includes one or more integrated devices 110. Example integrated devices 110 include capacitors, inductors, resistors, or other suitable components. As an example, an integrated device 110 is a silicon deep trench capacitor. In other implementations, the layer 105 of the carrier wafer 100 includes active components. The layer 105 of the carrier wafer 100 including the one or more integrated devices 110 is a fraction of an overall thickness of the carrier wafer 100. For example, the carrier wafer 100 has a thickness of 700 microns, while the layer 105 of the carrier wafer 100 including the one or more integrated devices 110 is 50 microns.

In various implementations, the set of through-silicon vias 205 are formed 1405 as further described above in conjunction with FIG. 2. For example, a through-silicon via 205 is etched into the carrier wafer 100 through lithography, such as through photolithography. As further described above in conjunction with FIG. 2, after etching, a through-silicon via 205 is formed by applying an insulating layer to the opening formed through the etching and applying a barrier layer to the insulating layer. A seed layer of conductive material is applied to the barrier layer, with additional conductive material applied to the seed layer, as further described above in conjunction with FIG. 2.

A die 305 is coupled 1410 to a top surface of the carrier wafer 100 using hybrid bonding so one or more connection layers 310 of the die 305 are coupled to one or more of the through-silicon vias 205 through the hybrid bonding. Additionally, one or more of the integrated devices 110 are coupled to one or more connection layers 310 of the die through the hybrid bond. Hence, the die 305 is coupled 1410 to the top surface of the carrier wafer 100 a time after the set of through-silicon vias 205 were formed 1405. As further described above in conjunction with FIG. 1, the top surface of the carrier wafer 100 is a surface of the carrier wafer 100 having exposed conductive portions of one or more of the integrated devices 110. Hence, the top surface of the carrier wafer 100 is a surface of the layer 105 of the carrier wafer 100 including the integrated devices 110.

A second wafer 400 is coupled 1415 to a top surface of the die 305, with the top surface of the die 305 substantially parallel to and generally opposite to a surface of the die 305 that is coupled 1410 to the top surface of the carrier wafer 100. In various implementations, the second wafer 400 is coupled to the top surface of a die 305 using fusion bonding. In some implementations, an additional die 700 is coupled to the top surface of the die 305, with a bottom surface of the additional die 700 coupled to the top surface of the die 305. The second wafer 400 is coupled to the top surface of the additional die 700, with the top surface of the additional die 700 substantially parallel to and generally opposite to the top surface of the die 305. In various implementations, the second wafer 400 is coupled 1415 to the top surface of the die 305 using fusion bonding, while other methods are used to couple 1415 the second wafer 400 to the top surface of the die 305 or to the top surface of the additional die 700.

An amount is removed 1420 from the bottom surface of the carrier wafer 100 to reveal a conductive portion of one or more through-silicon vias 205 of the set. In various implementations, the amount is removed 1420 from the bottom surface of the carrier wafer 100 to reveal a conductive portion of at least one of the through-silicon vias 205 of the set. The amount is removed 1420 form the bottom surface of the carrier wafer 100 through grinding in various implementations, while in other implementations, other methods are used to remove 1420 the amount of the bottom surface of the carrier wafer 100. Removing 1420 the amount from the bottom surface of the carrier wafer 100 results in the layer 105 of the carrier wafer 100 including the integrated devices 110 remaining coupled to the die 305, with conductive portions of one or more of the through-silicon vias 205 exposed from the layer 105 of the carrier wafer, allowing the die 305 to be coupled to one or more other components. For example, a connector 610, such as a solder bump, is coupled to an exposed portion a through-silicon via 205, as further described above in conjunction with FIG. 6. Coupling the connector 610 to the revealed conductive portion of a through-silicon via 205, allowing the die 305 to be coupled to another component through the through-silicon via 205 and the connector 610.

Figure 15:
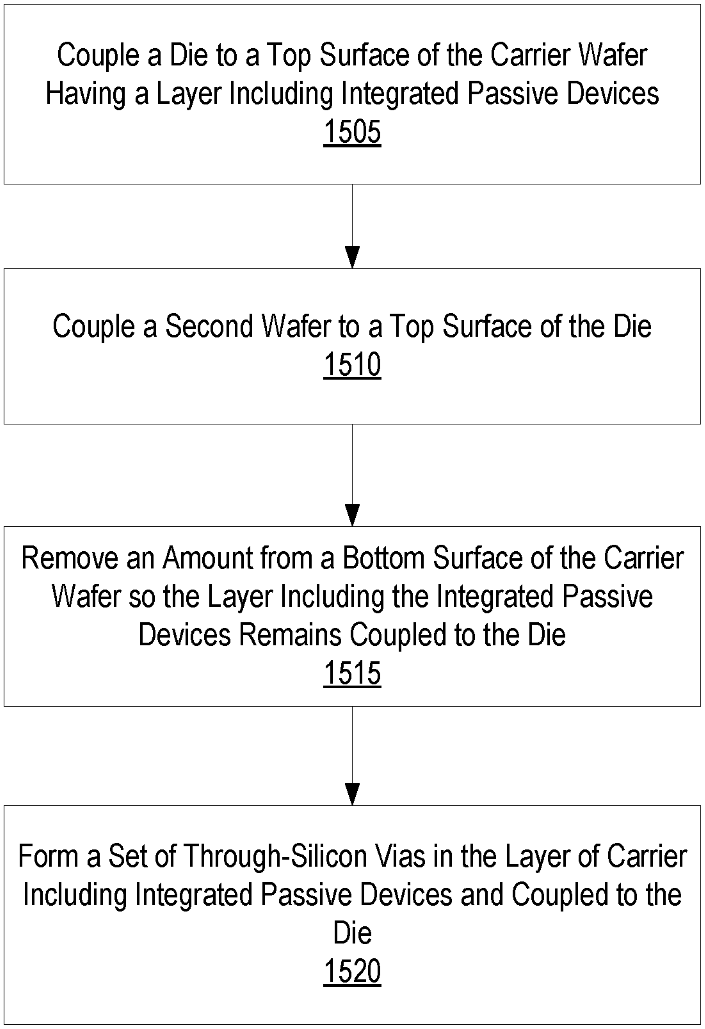
FIG. 15 is a flow chart illustrating an alternative example method for manufacturing a semiconductor assembly including one or more integrated devices in a carrier wafer according to some implementations.

For further explanation, FIG. 15 sets forth a flow chart illustrating an alternative example method for manufacturing a semiconductor assembly including one or more integrated devices 110 in a layer 105 of a carrier wafer 100. In the example method shown by FIG. 15, a die 305 is coupled 1505 to a top surface of the carrier wafer 100. The carrier wafer 100 has a layer that includes one or more integrated devices 110. Example integrated devices 110 include capacitors, inductors, resistors, or other suitable components. As an example, an integrated device 110 is a silicon deep trench capacitor. In other implementations, the layer 105 of the carrier wafer 100 includes active components. The layer 105 of the carrier wafer 100 including the one or more integrated devices 110 is a fraction of an overall thickness of the carrier wafer 100. For example, the carrier wafer 100 has a thickness of 700 microns, while the layer 105 of the carrier wafer 100 including the one or more integrated devices 110 is 50 microns. One or more connection layers 310 of the die 305 are coupled to one or more of the integrated devices 110 through the hybrid bonding.

As further described above in conjunction with FIG. 1, the top surface of the carrier wafer 100 is a surface of the carrier wafer 100 having one or more exposed conductive portions of one or more of the integrated devices 110. Hence, the top surface of the carrier wafer 100 is a surface of the layer 105 of the carrier wafer 100 including the integrated devices 110. The carrier wafer 100 also includes a "bottom surface" that is opposite to and parallel to the top surface. Hence, the bottom surface of the carrier wafer is farthest from the integrated devices 110.

A second wafer 400 is coupled 1510 to a top surface of the die 305, with the top surface of the die 305 parallel to and opposite to a surface of the die 305 that is coupled 1510 to the top surface of the carrier wafer 100. In various implementations, the second wafer 400 is coupled to the top surface of a die 305 using fusion bonding. In some implementations, an additional die 700 is coupled to the top surface of the die 305, with a bottom surface of the additional die 700 coupled to the top surface of the die 305. The second wafer 400 is coupled to the top surface of the additional die 700, with the top surface of the additional die 700 parallel to and opposite to the top surface of the die 305. In various implementations, the second wafer 400 is coupled 1510 to the top surface of the die 305 using fusion bonding, while other methods are used to couple 1510 the second wafer 400 to the top surface of the die 305 or to the top surface of the additional die 700.

An amount is removed 1515 from the bottom surface of the carrier wafer 100. In various implementations, the amount is removed 1420 from the bottom surface of the carrier wafer 100 to reveal a conductive portion of at least one of the through-silicon vias 205 of the set. The amount is removed 1420 form the bottom surface of the carrier wafer 100 through grinding in various implementations, while in other implementations, other methods are used to remove 1420 the amount of the bottom surface of the carrier wafer

100. As further described above in conjunction with FIG. 10, the amount removed 1515 from the bottom surface of the carrier wafer 100 is based on a thickness of the layer 105 of the carrier wafer 100 including the integrated devices 110. In various embodiments, the amount removed from the bottom surface of the carrier wafer 100 is a difference between a thickness of the carrier wafer 100 and a thickness of the layer 105 of the carrier wafer including the integrated devices 110. In another example, the amount removed from the bottom surface of the carrier wafer 100 is within a threshold value of the difference between the thickness of the carrier wafer 100 and the thickness of the layer 105 of the carrier wafer including the integrated devices 110.

A set of through-silicon vias 205 are formed 1520 in the layer 105 of the carrier wafer 100 including the integrated devices 110 that remains coupled to the die 305 after removing 1515 the amount of the carrier wafer 100 from the bottom surface of the carrier wafer 100. In the method described in conjunction with FIG. 15, the set of through-silicon vias 205 are formed 1520 at a time after removing 1515 the amount of the carrier wafer 100 from the bottom surface of the carrier wafer 100. The set of through-silicon vias 205 are formed 1520 as further described above in conjunction with FIG. 2. For example, an opening is etched into the layer 105 of the carrier wafer 100 through lithography, such as through photolithography. As further described above in conjunction with FIG. 2, after etching, a through-silicon via 205 is formed by applying an insulating layer to the opening formed through the etching and applying a barrier layer to the insulating layer. A seed layer of conductive material is applied to the barrier layer, with additional conductive material applied to the seed layer, as further described above in conjunction with FIG. 2.

A conductive portion of one or more of the through-silicon vias 205 is exposed by the bottom surface of the layer 105 of the carrier wafer 100, with the bottom surface of the layer 105 of the carrier wafer 100 opposite to a surface of the carrier wafer 100 that is coupled 905 to the die 305 via hybrid bonding. As further described above in conjunction with FIG. 6, the exposed conductive portion of a through-silicon via 205 is capable of being coupled to another component. For example, the exposed conductive portion of a through-silicon via 205 is coupled to a connector 610 that is opposite to the die 305. Example connections 610 include, die pads, microbumps, solder bumps (e.g., Controlled Collapse Chip Connection (C4) bumps), or other connections 610 configured to electrically couple the die 305 to a substrate or to one or more other components.

In view of the explanations set forth above, readers will recognize that manufacturing an integrated circuit device assembly with a carrier wafer that includes integrated devices in a layer of the carrier wafer decreases a distance between the integrated devices in the layer of the carrier wafer and a die included in the integrated circuit device assembly. The reduced distance between the die and the integrated devices coupled to the die through hybrid bonding reduces voltage drops and an amount of leakage current from providing power to the die by the integrated devices in the layer of the carrier wafer. Similarly, having the integrated devices in the layer of the carrier wafer coupled to the die through hybrid bonding reduces a latency for providing power to the die from one or more integrated devices included in the layer of the carrier wafer. Further, inclusion of the integrated devices in a layer of the carrier wafer simplifies inclusion of the integrated devices in the integrated circuit device assembly during manufacturing of the integrated circuit device assembly.

It will be understood from the foregoing description that modifications and changes can be made in various implementations of the present disclosure. The descriptions in this specification are for purposes of illustration only and are not to be construed in a limiting sense. The scope of the present disclosure is limited only by the language of the following claims.

What is claimed is:

1. A method of manufacturing a semiconductor assembly comprising:

forming a set of through-silicon vias in a carrier wafer, where a layer of the carrier wafer includes integrated passive devices;

coupling a plurality of spaced apart dies to a top surface of the carrier wafer including the set of through-silicon vias using hybrid bonding, wherein one or more connection layers of each of the plurality of dies are directly coupled to one or more of the through-silicon vias and are directly coupled to one or more of the integrated passive devices;

coupling a second wafer to a top surface of the plurality of dies; and removing an amount from a bottom surface of the carrier wafer that includes the integrated passive devices and the through-silicon vias to reveal a conductive portion of at least one of the through-silicon vias included in the carrier wafer at a time after coupling the plurality of dies to the top surface of the carrier wafer and after coupling the second wafer to the top surface of the plurality of dies.

2. The method of claim 1, wherein the second wafer comprises a bulk material without passive or active devices, the method further comprising:

applying a gap fill material to areas between the plurality of dies to fill space between the dies before coupling the second wafer to the top surface of the plurality of dies; and coupling a solder bump to the conductive portion of the at least one of the through-silicon vias, the solder bump opposite to the die.

3. The method of claim 1, wherein the integrated passive devices comprise passive devices that are integrated into the carrier wafer and do not include surface mount devices.

4. The method of claim 3, wherein an integrated passive device comprises a capacitor.

5. The method of claim 4, wherein the capacitor comprises a silicon deep trench capacitor.

6. The method of claim 3, wherein an integrated passive device comprises an inductor.

7. The method of claim 1, wherein coupling the second wafer to the top surface of the die comprises:

coupling a bottom surface of an additional die to a top surface of the die; and coupling the second wafer to a top surface of the additional die.

8. The method of claim 1, wherein removing the amount from the bottom surface of the carrier wafer to reveal the conductive portion of at least one of the through-silicon vias comprises:

grinding away the amount of the carrier wafer from the bottom surface of the carrier wafer to expose the conductive portion of at least one of the through-silicon vias at a time after coupling the second wafer to the top surface of the die and to reduce a thickness of the carrier wafer that includes the integrated passive devices by at least 80%.

9. A method for forming a semiconductor assembly comprising:

coupling, using hybrid bonding, a plurality of spaced apart dies to a carrier wafer, where a layer of the carrier wafer includes integrated passive devices, a bottom surface the plurality of dies coupled to the carrier wafer, where one or more of the integrated passive devices are directly coupled to one or more connection layers of the plurality of dies;

coupling a second wafer to a top surface of the plurality of dies;

removing an amount from a bottom surface of the carrier wafer that includes the integrated passive devices at a time after coupling the plurality of dies to the carrier wafer and after coupling the second wafer to the top surface of the plurality of dies, resulting in the layer of the carrier wafer including the integrated passive devices remaining coupled to the plurality of dies; and forming a set of through-silicon vias in the layer of the carrier wafer between the layer of the carrier wafer including the integrated passive devices.

10. The method of claim 9, further comprising:

coupling a solder bump to a conductive portion of at least one of the through-silicon vias exposed from the layer of the carrier wafer, the solder bump opposite to the die.

11. The method of claim 9, wherein the integrated passive devices comprise passive devices that are integrated into the carrier wafer and do not include surface mount devices.

12. The method of claim 11, wherein an integrated passive device comprises a capacitor.

13. The method of claim 12, wherein the capacitor comprises a silicon deep trench capacitor.

14. The method of claim 9, wherein coupling a second wafer to the top surface of each of the one or more dies comprises:

coupling a bottom surface of an additional die to a top surface of one or more of the dies; and coupling the second wafer to a top surface of the additional die.

15. The method of claim 9, wherein removing the amount from the bottom surface of the carrier wafer resulting in the layer of the carrier wafer including the integrated devices remaining coupled to the plurality of dies comprises:

grinding away the amount from a bottom surface of the carrier wafer at a time after coupling the second wafer to the top surface of the plurality of dies.

16. The method of claim 9, wherein the amount from the bottom surface of the carrier wafer is based on a difference between a thickness of the carrier wafer and a thickness of the layer of the carrier wafer including the integrated devices.

17. A method of manufacturing a semiconductor assembly comprising:

forming a set of through-silicon vias in a carrier wafer, where a layer of the carrier wafer includes integrated passive devices;

coupling a plurality of dies to a top surface of the carrier wafer including the set of through-silicon vias using hybrid bonding, wherein one or more connection layers of each of the dies are directly coupled to one or more of the through-silicon vias and are directly coupled to one or more of the integrated passive devices;

coupling a second wafer to a top surface of the plurality of dies;

removing an amount from a bottom surface of the carrier wafer that includes the integrated passive devices and the through-silicon vias to reveal a conductive portion of at least one of the through-silicon vias included in the carrier wafer at a time after coupling the plurality of dies to the top surface of the carrier wafer and after coupling the second wafer to the top surface of the plurality of dies; and coupling a solder bump to the conductive portion of the at least one of the through-silicon vias, the solder bump opposite to the dies.

18. The method of claim 17, wherein the integrated passive devices comprise a capacitor.

19. The method of claim 18, wherein the capacitor comprises a silicon deep trench capacitor.

20. The method of claim 17, wherein the integrated passive devices comprise an inductor.

* * * * *